United States Patent
Niwa et al.

(10) Patent No.: US 6,255,911 B1
(45) Date of Patent: Jul. 3, 2001

(54) PLL CIRCUIT PROTECTED AGAINST NOISE AND MISSING PULSES IN A REFERENCE SIGNAL

(75) Inventors: Takahiro Niwa, Kasugai; Akihiro Itakura, Kawasaki, both of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/453,973

(22) Filed: Dec. 3, 1999

(30) Foreign Application Priority Data

Dec. 10, 1998 (JP) .................................................. 10-351257

(51) Int. Cl.[7] .............................. H03L 7/085; H03L 7/18
(52) U.S. Cl. .................. 331/14; 331/17; 331/25; 331/27; 360/51
(58) Field of Search ................................. 331/14, 17, 25, 331/27; 360/51

(56) References Cited

U.S. PATENT DOCUMENTS 4,901,035 * 2/1990 Cleveland .............................. 331/14
5,410,572 * 4/1995 Yoshida .................................. 331/14

FOREIGN PATENT DOCUMENTS 10134515 5/1998 (JP) .

* cited by examiner

Primary Examiner—Siegfried H. Grimm
(74) Attorney, Agent, or Firm—Greer, Burns & Crain, Ltd.

(57) ABSTRACT

A PLL circuit used in an apparat as for reading and writing data to a disk compensates for noise which causes a false clock signal or for missing clock signals which can be caused by a scratch or smudge on the surface of the disc. The PLL circuit includes a phase comparator for comparing a phase of a reference signal with a phase of a feedback signal and generates a phase difference signal. A charge pump receives the phase difference signal and generates an output signal, which is filtered by a low pass filter. The filtered signal is provided to a voltage controlled oscillator, which generates an oscillation output signal. A divider divides the oscillation output signal and generates the feedback signal. A time information generating circuit generates time information of the oscillation output signal, indicating the time period where it is presumed the reference signal is or should be received. A control circuit, using the time information, permits the output of the oscillation output signal when the reference signal is input during the presumed time period and maintains the output of the oscillation output signal when the reference signal is not received during the presumed time period.

30 Claims, 8 Drawing Sheets

PLL CIRCUIT PROTECTED AGAINST NOISE AND MISSING PULSES IN A REFERENCE SIGNAL

BACKGROUND OF THE INVENTION

The present invention relates to a phase locked loop (PLL) circuit, and more particularly, to a PLL circuit that is preferable for use in a disk apparatus.

In addition to data, clock information is recorded on a recording medium, such as a magnetic disk or an optical disk. Clock information is recorded when the recording medium is formatted or when data is written on the recording medium. With reference to FIG. 1, clock information c may be recorded on the recording medium when the recording medium is manufactured. A spiral recording track 100 is formed on the recording medium. The clock information c is recorded on the track 100 at equal angular intervals.

A disk apparatus, which reads and writes data on a recording medium, includes a PLL circuit 101 as shown in FIG. 2. Referring also to FIG. 1, the PLL circuit 101 multiplies a reference clock signal RC, which is based on the clock information c read from a recording medium 102, by a multiplication ratio N to generate a clock signal CLK. The disk apparatus records data on the recording track 100 from one clock information c to the next clock information c in accordance with the clock signal CLK.

However, if the recording surface is scratched for one reason or another or if the recording surface is smudged, the clock information c may be detected at a location differing from its original position or may not even be detected at all.

Referring to FIG. 3(a), when information similar to the clock information c is recorded at a location that differs from the original position, noise X may be included in the reference clock signal RC and thereby shorten the pulse cycle of the reference clock signal RC. Although only a single pulse of the noise X is shown in FIG. 3(a), a plurality of fine noise pulse signals would actually be included in the reference clock signal RC. Referring to FIG. 3(b), when there is missing clock information c, the pulse cycle of the reference clock signal RC at the location Y where the clock information c is missing becomes long. The cycle of a clock signal CLK generated by such an erroneous reference clock signal RC differs from the cycle of an optimal clock signal CLK generated by a normal clock information c. Accordingly, the PLL circuit 101 requires a long length of time to generate an optimal and stable clock signal CLK from the recorded clock information c. Consequently, an error may occur when data is read or written (read/write error) and the time required to access the disk may increase.

SUMMARY OF THE INVENTION

Accordingly, it is an object of the present invention to provide a PLL circuit that generates a normal clock signal even if noise is included in the reference clock signal or even if a pulse is missing in the reference clock signal.

To achieve the above object, the present invention provides a PLL circuit including a phase comparator for comparing a phase of a reference signal and a phase of a feedback signal and generating a phase difference signal. A charge pump is connected to the phase comparator to generate an output signal in accordance with the phase difference signal. A low-pass filter is connected to the charge pump for smoothing the charge pump output signal and generating a control voltage signal. A voltage controlled oscillator is connected to the low-pass filter to generate an oscillation output signal having a frequency corresponding to the control voltage signal. A divider is connected to the voltage controlled oscillator to divide the oscillation output signal and generate the feedback signal. A time information generating circuit is connected to the divider to generate time information from the oscillation output signal. The time information indicates a predetermined time period during which a presumed input time of the reference signal is included. A control circuit is connected to the time information generating circuit. The control circuit refers to the time information to permit the output of the oscillation output signal when the reference signal is being input during the predetermined time period and maintain the output of the oscillation output signal, having a predetermined cycle, when the reference signal is not being input during the predetermined time period.

In another aspect of the present invention, a control device of a PLL circuit is provided. The PLL circuit includes a voltage controlled oscillator for comparing the phase of a reference signal and the phase of a feedback signal and generating an oscillation output signal having a frequency corresponding to a control voltage signal. The control device includes a control circuit that refers to time information generated from the oscillation output signal and indicating a predetermined time period during which a presumed input time of the reference signal is included. The control circuit permits the output of the oscillation output signal when the reference signal is input during the predetermined time period and maintains the output of the oscillation output signal, having a predetermined cycle, when the reference signal is not input during the predetermined time period.

In a further aspect of the present invention, a disk apparatus for reproducing data recorded on a recording medium and/or writing data on a recording medium in accordance with an oscillation output signal is provided. The disk apparatus includes a PLL circuit for comparing a phase of a reference signal and a phase of a feedback signal. The PLL circuit includes a voltage controlled oscillator for generating the oscillation output signal having a frequency corresponding to a control voltage signal. The reference signal is generated based on clock information recorded on the recording medium. The disk apparatus further includes a control device of the PLL circuit. The control device has a control circuit that refers to time information generated from the oscillation output signal and indicating a predetermined time period during which a presumed input time of the reference signal is included. The control circuit permits the output of the oscillation output signal when the reference signal is input during the predetermined time period and maintains the output of the oscillation output signal having a predetermined cycle when the reference signal is not input during the predetermined time period.

In a further aspect of the present invention, a method for controlling a PLL circuit of a disk apparatus is provided. The disk apparatus reproduces data recorded on a recording medium and/or writes data on a recording medium in accordance with a clock signal. The PLL circuit compares a phase of a reference signal and a phase of a feedback signal to determine if they match a phase of the clock signal. The method includes the steps of maintaining the output of the clock signal preceding a seek operation when the disk apparatus is performing the seek operation on the recording medium by deactivating the phase matching carried out by the PLL circuit and commencing the phase matching when the seek operation is completed.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the preferred embodiments together with the accompanying drawings in which.

DETAILED DESCRIPTION OF THE PREFERRED EMBODIMENT

Figure 4:
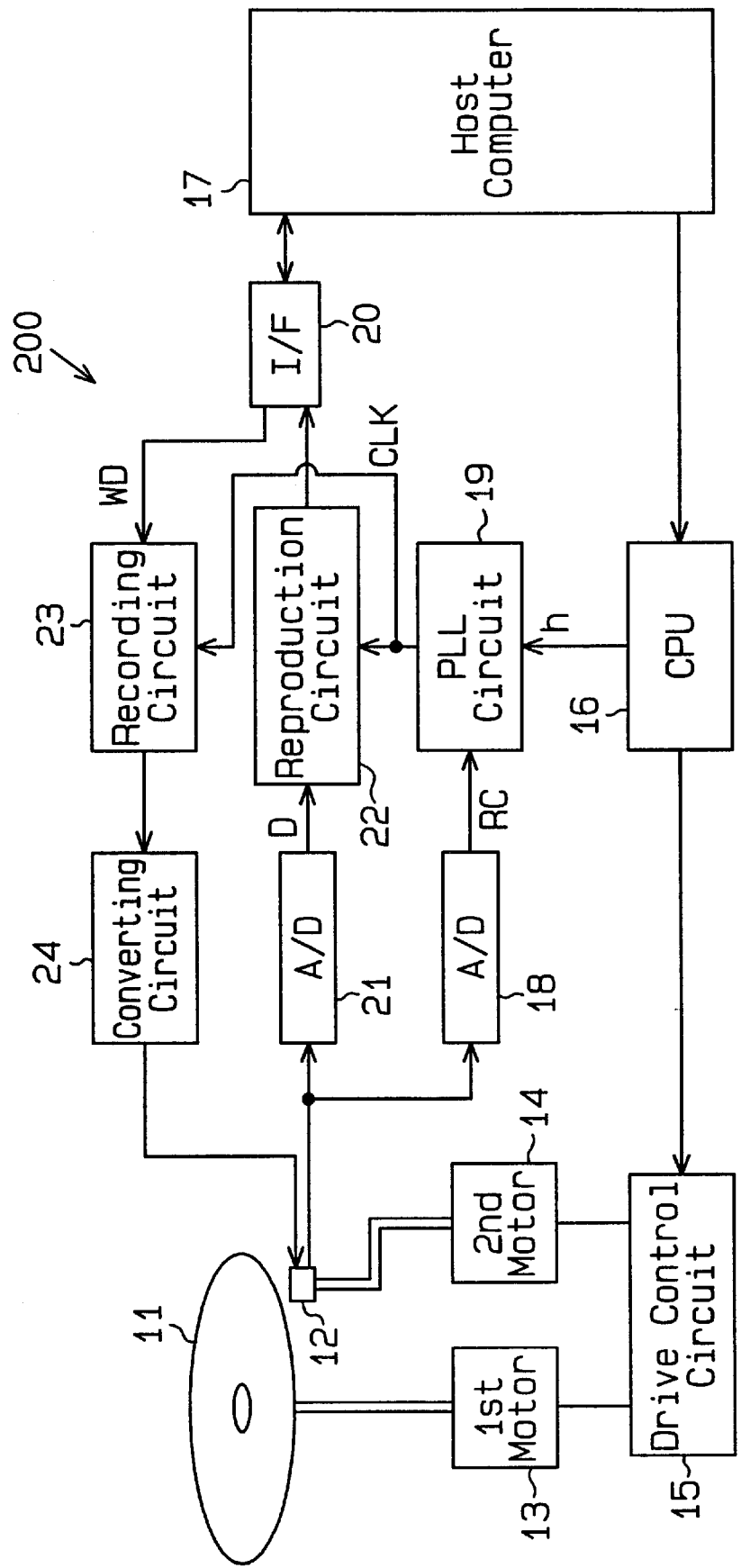
FIG. 4 is a schematic block diagram showing a disk apparatus according to the present invention.

FIG. 4 is a schematic block diagram showing a disk apparatus 200 according to the present invention. Clock information c is recorded on a track of an optical disk 11 at equal angular intervals. The disk apparatus 200 reads data from and writes data to the optical disk 11. The disk apparatus 200 includes a head 12, a first motor 13, a second motor 14, a drive control circuit 15, a CPU 16, a host computer 17, a first A/D converter 18, a second A/D converter 21, a PLL circuit 19, an input/output interface 20, a reproduction circuit 22, a recording circuit 23, and a converting circuit 24.

The first and second motors 13, 14, the drive control circuit 15, the CPU 16, the host computer 17, the first and second A/D converters 18, 21, the PLL circuit 19, the input/output interface 20, and the reproduction circuit 22 form a data read device. The first and second motors 13, 14, the drive control circuit 15, the CPU 16, the host computer 17, the first A/D converter 18, the PLL circuit 19, the input/output interface 20, the recording circuit 23, and the converting circuit 24 form a data write device.

The optical disk 11 mounted on the disk apparatus 200 is rotated at a predetermined speed by the first motor 13. The head 12 is moved radially along the optical disk 11 by the second motor 14. The first and second motors 13, 14 are controlled by the drive control circuit 15. A head control circuit (not shown) controls the head 12 to write data on the optical disk 11 or read data from the optical disk 11. The drive control circuit 15 and the head control circuit are controlled by the CPU 16, which is further controlled by command signals provided by the host computer 17.

Figure 1:
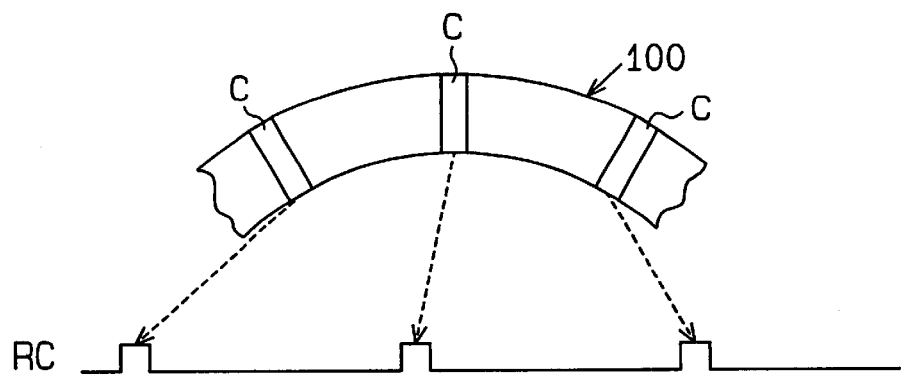
FIG. 1 is a schematic diagram illustrating clock information recorded on a track of a disk and a chart showing the waveforms of a reference clock signal and a clock signal.
Figure 2:
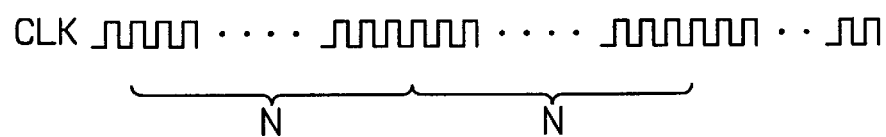
FIG. 2 is a schematic block diagram showing a PLL circuit of a prior art disk apparatus.
Figure 3A:
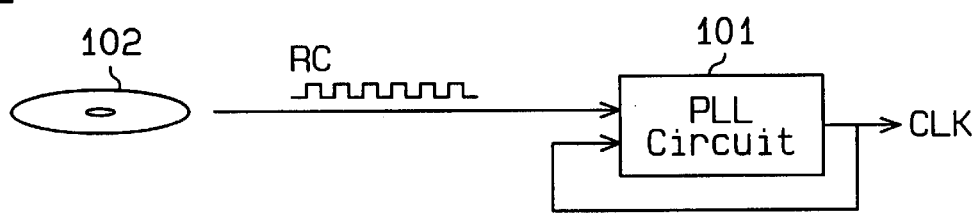
FIGS. 3(a) and 3(b) are charts each showing the waveform of a reference clock signal generated by the disk apparatus of FIG. 2.
Figure 3B:
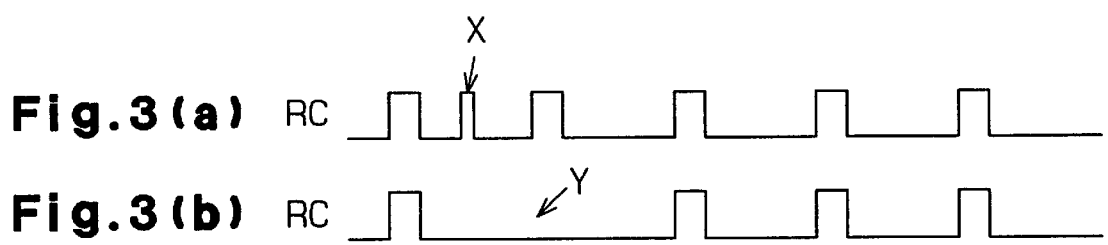

To write or read data, the head 12 picks up the clock information c from the rotating optical disk 11 and provides an analog reference clock signal to the first A/D converter 18. The first A/D converter 18 converts the analog reference clock signal to a digital reference clock signal RC of "0" or "1" (refer to FIG. 1). The reference clock signal RC is then provided to the PLL circuit 19. The PLL circuit 19 multiplies the reference clock signal RC by a predetermined multiplication ratio N to generate a clock signal CLK (refer to FIG. 1).

The operation for reading data from the optical disk 11 will now be described.

The second A/D converter 21 converts the analog signal of the data recorded on the optical disk 11 (excluding the clock information c) to a digital data signal D and provides the digital data signal D to the reproduction circuit 22. The clock information c is recorded when the optical disk 11 is manufactured, while other data may be recorded on the optical disk 11 at other times. Accordingly, the first A/D converter 18 generates the reference clock signal RC from the analog signal of the clock information c, and the second A/D converter 21 generates the digital data signal D from the analog signal of the data excluding the clock information c.

A demodulation circuit is preferably used as the reproduction circuit 22. The reproduction circuit 22 performs a known demodulation process on the digital data signal D in accordance with the clock signal CLK from the PLL circuit 19 and decodes the demodulated data signal to reproduce the recorded data. The reproduced data is provided to the host computer 17 via the input/output interface 20.

The operation for writing data on the optical disk 11 will now be described.

Write data WD is provided to the recording circuit 23 from the host computer 17 via the input/output interface 20. A modulation circuit is preferably used as the recording circuit 23. The recording circuit 23 performs a known modulation process on the write data WD in accordance with the clock signal CLK and provides the modulated data signal to the converting circuit 24. The converting circuit 24 converts the modulated data signal to a formatted data signal, provides the formatted data signal to the head 12, and then the data is written on the optical disk 11.

The PLL circuit 19 will now be described with reference to FIGS. 5 and 6. The PLL circuit 19 includes a control circuit 31, a phase comparator 32, a charge pump 33, a low-pass filter (LPF) 34, a voltage controlled oscillator (VCO) 35, a divider 36, and a time information generating circuit 37. The control circuit 31, the phase comparator 32, the charge pump 33, the divider 36, and the time information generating circuit 37 are preferably formed on the same semiconductor substrate. The control circuit 31 and the time information generating circuit 37 form a control device of the PLL circuit 19.

The control circuit 31 receives the reference clock signal RC, a time information signal k, and a self-advance command signal h. The time information signal k is provided by the time information generating circuit 37 and set at a high level when a seek operation is being conducted. The control circuit 31 delays the reference clock signal RC to generate a delay reference signal i and provides the delay reference signal i to the phase comparator 32. Further, the control circuit 31 generates a control signal j to selectively activate the phase comparator 32 in accordance with the reference clock signal RC, the time information signal k, and the self-advance command signal h and provides the control signal j to the phase comparator 32.

More specifically, the control circuit 31 provides a low control signal j to the phase comparator 32 in response to the high self-advance command signal h during the seek operation. The low control signal j serves as a maintaining signal which deactivates the phase comparator 32. The control circuit 31 also provides the low control signal j to the phase comparator 32 in response to a low self-advance command signal h and a low time information signal k. When the control circuit 31 receives a low self-advance command signal h and a high term information signal k, the control circuit 31 provides a high control signal j to the phase comparator 32 for a predetermined time period if the reference clock signal RC goes high. The high control signal j serves as a renewal permission signal which immediately activates the phase comparator 32. The delay reference signal i is generated at a predetermined time within the predetermined time period during which the high control signal j is output.

The phase comparator 32 receives the delay reference signal i and the control signal j from the control circuit 31, and a divisional signal m1, which is a feedback signal, from the divider 36. The phase comparator 32 is deactivated by a low control signal j. Thus, if the control signal j is low, the phase comparator 32 does not compare the delay reference signal i with the divisional signal m1. When the phase comparator 32 is activated by a high control signal j, the phase comparator 32 compares the delay reference signal i with the divisional signal m1 and provides a phase difference signal p (pulse signal) to the charge pump 33 in accordance with the phase difference.

The charge pump 33 provides an output current to the LPF 34 in accordance with the pulse signal p. The LPF 34 smoothes the output current and generates a direct current control voltage from which high frequency components are eliminated. The VCO 35 generates the clock signal CLK, which has a frequency corresponding to the value of the direct current control voltage, and provides the clock signal CLK to the reproduction circuit 22, the recording circuit 23 and the divider 36.

The divider 36 divides the clock signal CLK by N to generate the divisional signal m1 and provides the divisional signal m1 to the phase comparator 32. The divisional signal m1 rises once every N times the clock signal CLK rises. The divider 36 counts the pulses of the clock signal CLK and provides the count value s to the time information generating circuit 37.

Based on the count value s, the time information generating circuit 37 generates a high time information signal k for a predetermined time period t, which includes the time when the reference clock signal RC is presumed to rise. The period during which the reference clock signal RC is presumed to rise is the period starting from when counting of the clock signal CLK is started to when an N number of pulses are counted. In the preferred and illustrated embodiment, the predetermined time period t corresponds to when the count value s is "N–2", "N–1", "N, or 0", and "1" (refer to FIGS. 7 and 8).

Figure 6:
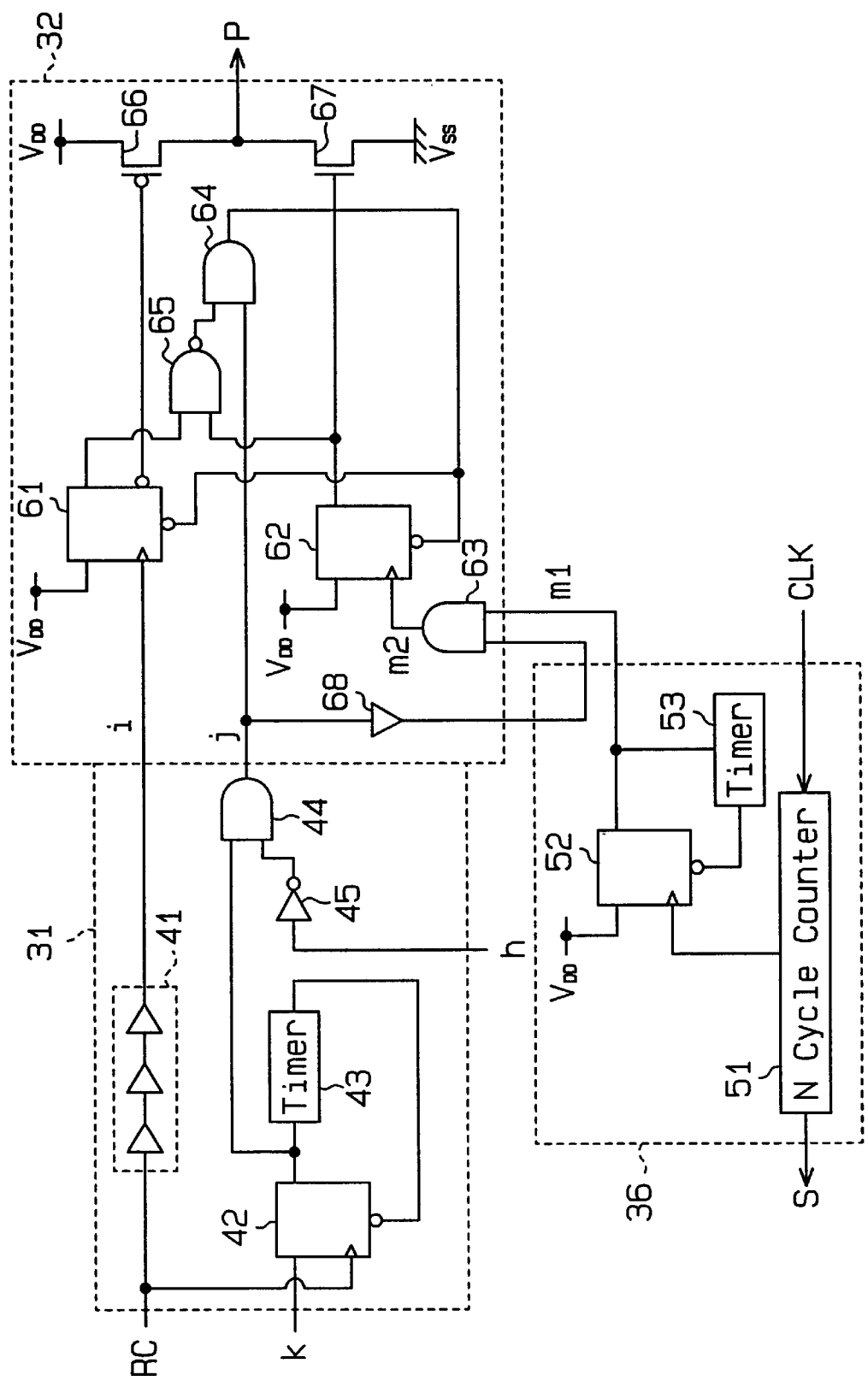
FIG. 6 is a schematic block diagram illustrating a control circuit, a phase comparator, and a divider of the PLL circuit of FIG. 5.

FIG. 6 is a schematic circuit diagram illustrating the control circuit 31, the phase comparator 32, and the divider 36.

The control circuit 31 includes a delay circuit 41, a D flip-flop circuit (DFF) 42, a timer 43, an AND circuit 44, and an inverter 45. The delay circuit 41 has multiple buffer circuits (in this case, three) to delay the reference clock signal RC and generate the delay reference signal i.

The DFF 42 has a data terminal for receiving the time information signal k, a clock signal terminal for receiving the reference clock signal RC, and a clear signal terminal for receiving the output signal of the DFF 42 via the timer 43. When the DFF 42 receives a high time information signal k, the DFF 42 latches it and generates a high output signal when the reference clock signal RC rises.

In response to the DFF 42 high output signal, the timer 43 performs a count operation for a predetermined time and provides a clear signal to the DFF 42 when the predetermined time elapses. Accordingly, the DFF 42 provides the high output signal for a predetermined time in response to the rising of the reference clock signal RC and the high time information signal k.

The AND circuit 44 receives the output signal from the DFF 42 and the self-advance command signal h via the inverter 45. The AND circuit 44 generates a low control signal j (maintaining signal) in response to a high self-advance command signal h. The AND circuit 44 generates a high control signal j (renewal permission signal) in response to a low self-advance command signal h and a high DFF 42 output signal.

The divider 36 includes an N cycle counter 51, a DFF 52, and a timer 53. The N cycle counter 51 receives the clock signal CLK from the VCO 35, counts the pulses of the clock signal CLK, and outputs the count value s. Further, the N-cycle counter 51 provides a pulse signal to the clock input of the DFF 52 each time the clock signal CLK rises an N number of times.

The DFF 52 has a data signal terminal to which voltage from a high potential power supply VDD is applied, a clock signal terminal for receiving the pulse signal from the N cycle counter 51, and a clear signal terminal for receiving the output signal of the DFF 52 via the timer 53. The DFF 52 provides a high output signal as the divisional signal m1 when the pulse signal from the N cycle counter 51 rises.

In response to the high output signal (divisional signal m1), the timer 53 performs a count operation for a predetermined time period and provides a clear signal to the DFF 52 when the predetermined time period elapses. Accordingly, the DFF 52 provides the high output signal as the divisional signal m1 for the predetermined time in response to the rising of the pulse signal from the N-cycle counter 51.

The phase comparator 32 includes two DFFs 61, 62, two AND circuits 63, 64, a NAND circuit 65, a p-channel MOS (PMOS) transistor 66, and an n-channel MOS (NMOS) transistor 67. The PMOS transistor 66 and the NMOS transistor 67 are connected in series between a high potential power supply $V_{DD}$ and a low potential power supply $V_{ss}$.

The DFF 61 has a data signal terminal to which voltage from the high potential power supply VDD is applied and a clock signal terminal for receiving the delay reference signal i from the control circuit 31. When the delay reference signal i rises, the DFF 61 provides a high output signal to the NAND circuit 65 and a low output signal to the gate of the PMOS transistor 66.

The AND circuit 63 receives the control signal j, which is delayed by a buffer circuit 68, from the control circuit 31 and the divisional signal m1 from the divider 36. In response to a high delayed control signal j and a high divisional signal m1, the AND circuit 63 outputs a high signal m2.

The DFF 62 has a data signal terminal to which voltage from the high potential power supply VDD is applied and a clock signal terminal for receiving the signal m2. When the signal m2 rises, the DFF 62 provides a high output signal to the gate of the NMOS transistor 67 and the NAND circuit 65.

The AND circuit 64 receives the output signal of the NAND circuit 65 and the control signal j from the control circuit 31. The output signal of the AND circuit 64 is provided to the clear signal terminals of the DFFs 61, 62. Accordingly, when the control signal j goes low, the DFFs 61, 62 are cleared and thus, provide a low output signal to the NMOS transistor 67 and a high output signal to the PMOS transistor 66. The cleared output signals deactivate the PMOS transistor 66 and the NMOS transistor 67. When the control signal j is high, the DFF 61 outputs a low signal in response to a high delay reference signal i. The low signal activates the PMOS transistor 66 causing a high phase difference signal P to be output from the drain of the transistor 66. Further, when the control signal j is high, the DFF 62 outputs a high signal in response to a high signal m2. The high signal activates the NMOS transistor 67 causing a low phase difference signal P to be output from the drain of the transistor 67. When either transistor 66 or 67 is activated and phase comparison is completed, the NAND circuit 65 outputs a low output signal. This causes the AND circuit 64 to output a low signal, which clears the DFFs 61, 62, and thus, deactivates the PMOS and NMOS transistors 66, 67.

Since the AND circuit 63 receives the delayed control signal j, the output signal m2 always rises after the control signal j. Accordingly, after the clearing process is completed, when the control signal j rises, the operation of the DFF 62 in response to the rising of the signal m2 is guaranteed.

The operation of the PLL circuit 19 will now be described with reference to FIGS. 7 to 12.

Figure 7:
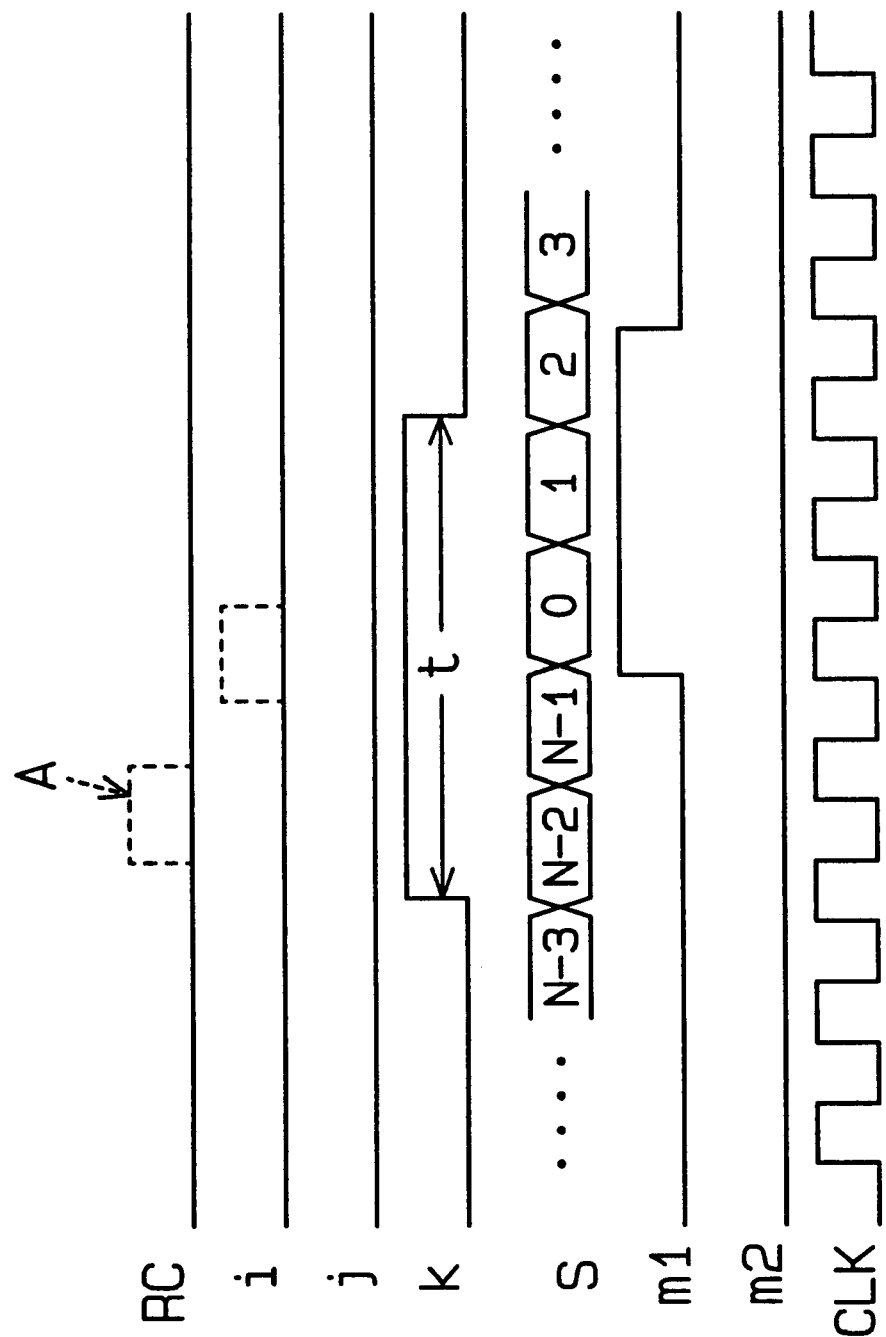
FIGS. 7 to 12 are timing charts for describing the operation of the PLL circuit of FIG. 5.

As shown in FIG. 7, if a pulse A (indicated by the broken line) of the reference clock signal RC is missing, the control circuit 31 continues to output a low delay reference signal i. The time information generating circuit 37 outputs a high time information signal k based on the count value s output from the divider 36 during the predetermined time period t when the count value s is between "N−2" and "2". However, the control circuit 31 maintains the control signal j at a low level since the reference clock signal RC does not rise during the predetermined time period t. Accordingly, the phase comparator 32 is maintained in a deactivated state. Hence, the phase comparator 32 does not perform the comparison operation even if the divisional signal m1, which is generated by counting an N number of pulses of the clock signal CLK, rises. As a result, the PLL circuit 19 maintains the cycle of the clock signal CLK.

Figure 8:
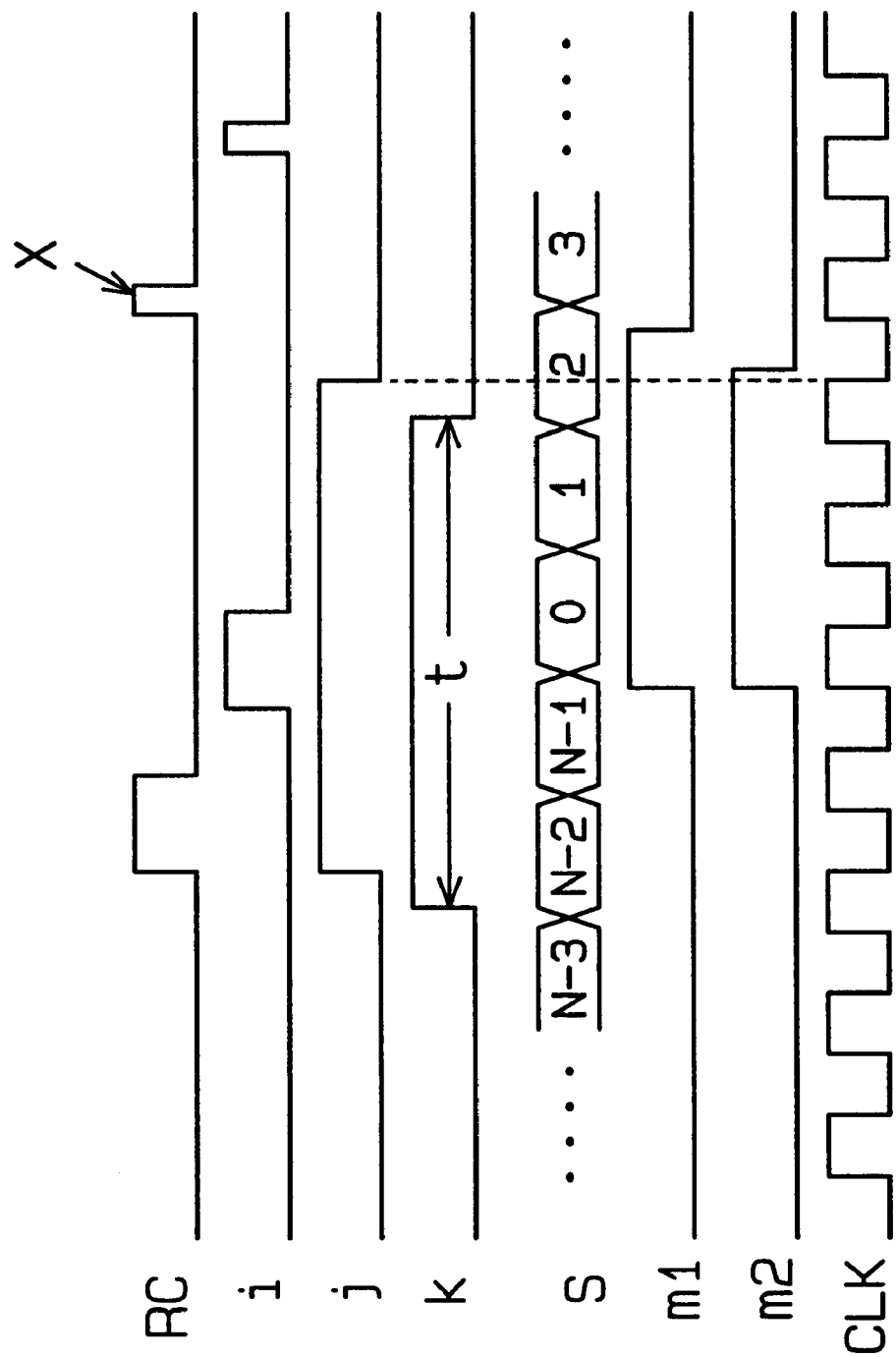

As shown in FIG. 8, when noise X is included in the reference clock signal RC outside the predetermined time period t (the count value s being between "N−2" and "2"), the control circuit 31 outputs a delay reference signal i including the noise X. The time information generating circuit 37 outputs a high time information signal k during the predetermined time period t between "N−2" and "2". The delay circuit 41 delays the reference clock signal RC so that the delay reference signal i rises at a predetermined time during the predetermined time period t.

When the reference clock signal RC rises during the predetermined time period t, the DFF 42 of the control circuit 31 outputs a high control signal j (renewal permission signal) which is maintained at the same level during the predetermined time period t. The high control signal j indicates that the reference clock signal RC is normal.

It is preferred that the time delayed by the buffer circuit 68 be the same as the time from when the reference clock signal RC is received to when the cleared state of the DFFs 61, 62 is cancelled. When the phase of the divisional signal m1 is advanced from that of the delay reference signal i, the phase comparison operation is performed in accordance with a fixed phase delay determined by the delay time of the buffer circuit 68 and the delay circuit 41.

The phase comparator 32 is activated by a high control signal j and outputs the phase difference signal P by comparing the delay reference signal i with a signal based on the divisional signal m1 (the output signal m2 of the AND circuit 63). Accordingly, the PLL circuit 19 generates the clock signal CLK in accordance with a normal reference clock signal RC.

When the predetermined time t elapses and the control signal j falls, the phase comparator 32 is deactivated. When the predetermined time period t elapses, the time information signal k has already gone low. Thus, even if the noise X is included in the delay reference signal i, the DFF 42 does not output a high control signal j (the renewal permission signal) when the pulse of the noise X rises. In other words, the pulse of the noise X is acknowledged as being abnormal. Therefore, the comparison operation is not performed even if the delay reference signal i goes high because of the noise X. Accordingly in this situation, the PLL circuit 19 maintains the cycle of the generated clock signal CLK.

Figure 12:
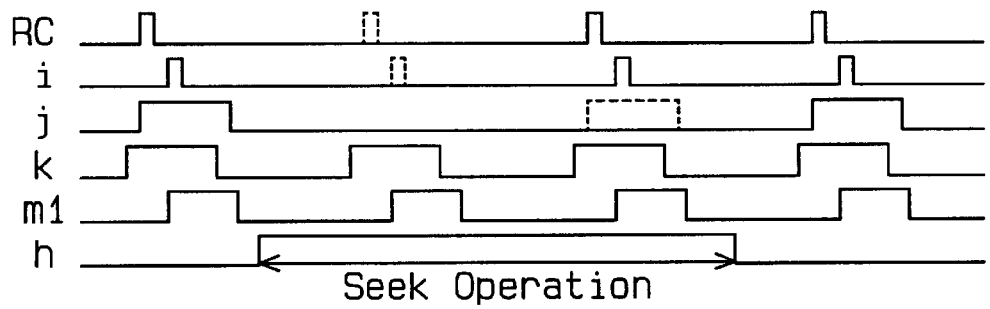

With reference to FIG. 12, when a high self-advance signal h is provided by the CPU 16 during the seek operation, the control circuit 31 outputs a low control signal j and deactivates the phase comparator 32. Accordingly, during the seek operation, the PLL circuit 19 maintains the cycle of the generated clock signal CLK regardless of the rising of the reference clock signal RC and the divisional signal m1.

The comparison operation performed by the phase comparator 32 will now be described.

Figure 9:
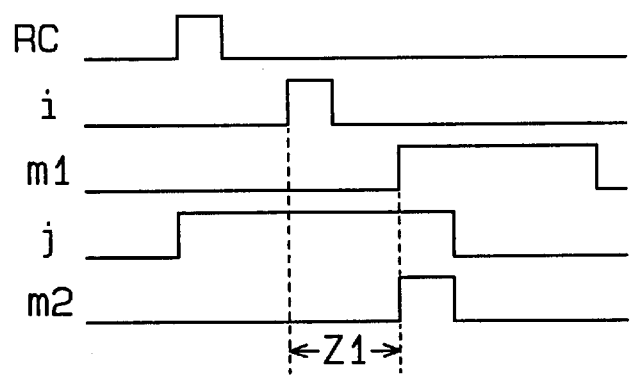

Referring to FIG. 9, if the divisional signal m1 rises later than the delay reference signal i when the control signal j is high, the signal m2 rises synchronously with the divisional signal m1. Accordingly, the phase comparator 32 generates the phase difference signal P in accordance with the phase difference Z1 between the rising of the delay reference signal i and the rising of the signal m1.

Figure 10:
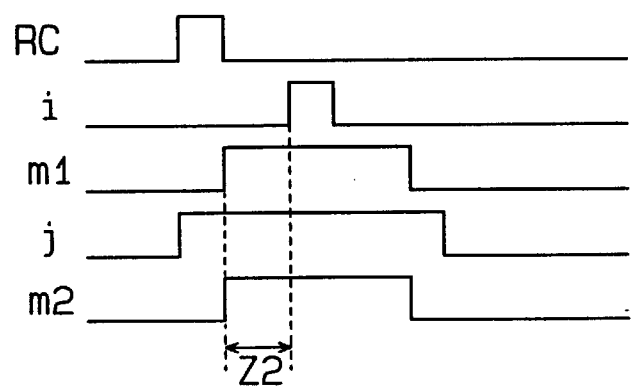

Referring to FIG. 10, if the divisional signal m1 rises before the delay reference signal i when the delay time of the buffer circuit 68 elapses subsequent to the rising of the control signal j, the signal m2 rises synchronously with the divisional signal m1. Accordingly, the phase comparator 32 generates the phase difference signal P in accordance with the phase difference Z2 between the rising of the signal m1 and the rising of the delay reference signal i.

Figure 11:
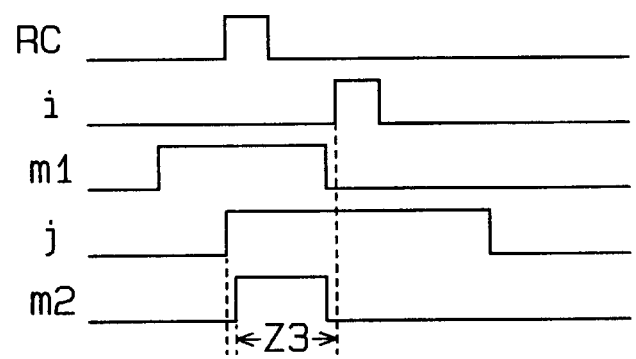

Referring to FIG. 11, if the divisional signal m1 rises before the delay time of the buffer circuit 68 elapses subsequent to the rising of the control signal j, the signal m2 rises slightly after the control signal j rises and falls after the delay time of the buffer circuit 68 elapses subsequent to the rising of the control signal j. Accordingly, the phase comparator 32 generates the phase difference signal P in accordance with the phase difference Z3 between the rising of the signal m2 and the rising of the delay reference signal i.

Although the phase difference Z3 is not the phase difference between the divisional signal m1 and the delay reference signal i, the PLL circuit 19 operates so that the rising of the delay reference signal i approaches the rising of the divisional signal m1. In other words, if the phase of the divisional signal m1 is advanced from the phase of the delay reference signal i, the phase of the divisional signal m1 is delayed in accordance with the a fixed value, or the phase difference Z3, which is determined by the delay circuit 41. The comparison operation is repeated until the divisional signal m1 is generated as shown in FIG. 10, and the phase between the divisional signal m1 and the delay reference signal i is compared.

The preferred and illustrated embodiment has the advantages described below.

(1) Based on the count value s received from the divider 36, the time information generating circuit 37 generates a high time information signal during the predetermined time period between the count values of "N−2" to "2". If the reference clock signal RC rises during the predetermined period t, the control circuit 31 generates a high control signal j (renewal permission signal) during the predetermined time period and activates the phase comparator 32 with the high control signal j. The delay reference signal i based on the reference clock signal RC is compared with the signal m2 based on the divisional signal m1 to generate the clock signal CLK.

If the reference clock signal RC does not rise during the predetermined time period t, the control circuit 31 outputs a low control signal j (maintaining signal). The low control signal j deactivates the phase comparator 32 so that the comparison operation is not performed. This maintains the cycle of the preceding clock signal CLK. Accordingly, the normal clock signal CLK is generated based on the reference clock signal RC even if the noise X is included during a period outside the predetermined time period t or even if the pulse A of the reference clock signal RC is missing. Furthermore, the noise X is not used when performing the comparison operation. This decreases the time required to generate a stable clock signal CLK. Consequently, the number of errors that occur during the data write operation decreases, and the access time required to write data on the optical disk 11 decreases.

(2) The time information generating circuit 37 generates a high time information signal k during the predetermined time period t based on the count value s provided by the N cycle counter 51 of the divider 36. Thus, the time information signal k is generated without using a separate counter. This prevents the circuit scale of the PLL circuit 19 from being increased.

(3) The DFF 42 of the control circuit 31 determines whether the reference clock signal RC has gone high during the predetermined time period t. The control signal j is generated in accordance with the determination result and the phase comparator 32 is selectively activated. The reference clock signal RC is delayed to a predetermined timing during the predetermined time t and provided to the phase comparator 32 as the delay reference signal i. This produces a predetermined time from when the control signal j rises (i.e., when the phase comparator 32 is activated) to when the delay reference signal i rises. Accordingly, the comparison operation is performed accurately even if the divisional signal m1 rises before the delay reference signal (4) The high control signal j (renewal permission signal) is output as soon as the clock signal RC rises during the predetermined time period t. That is, the phase comparator 32 is activated to perform the comparison operation as soon as the reference clock signal RC rises during the predetermined time period t. Accordingly, the predetermined time period t for detecting whether the reference clock signal RC has gone high overlaps the activated time period of the phase comparator 32. This further decreases the time required to generate the clock signal CLK based on the reference clock signal RC.

(5) The control circuit 31 deactivates the phase comparator 32 by providing a low control signal j to the phase comparator 32 during the seek operation (i.e., when the self-advance signal h is high). Accordingly, the cycle of the preceding clock signal CLK is maintained. This decreases the time required for the PLL circuit 19 to generate the clock signal CLK after completion of the seek operation. As a result, the time required for accessing the optical disk 11 is decreased.

(6) By using the optical disk 11, on which the clock information c is recorded during its manufacturing process, clock information need not be written together with data.

It should be apparent to those skilled in the art that the present invention may be embodied in many other specific forms without departing from the spirit or scope of the invention. Particularly, it should be understood that the present invention may be embodied in the following forms.

Figure 13:
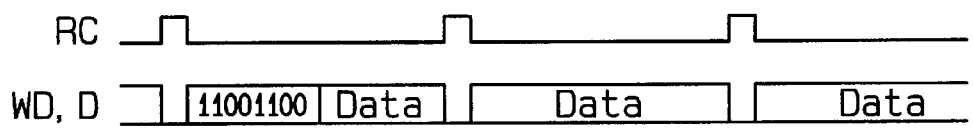
FIG. 13 is a schematic diagram illustrating a cycle pattern.

(a) The present invention may be applied to a data reproduction apparatus which uses a cycle pattern "11001100" to compensate for the phase of the clock signal and reproduce data. More specifically, the write data WD provided by the host computer 17 via the input/output interface 20 may include for example, a cycle pattern of "1001100" as shown in FIG. 13. The recording circuit 23 provides a signal based on the write data WD (including the cycle pattern) to the converting circuit 24. The head 12 writes data, which includes the cycle pattern "1001100", on the recording track (sector) excluding locations where the clock information c is recorded.

Figure 14:
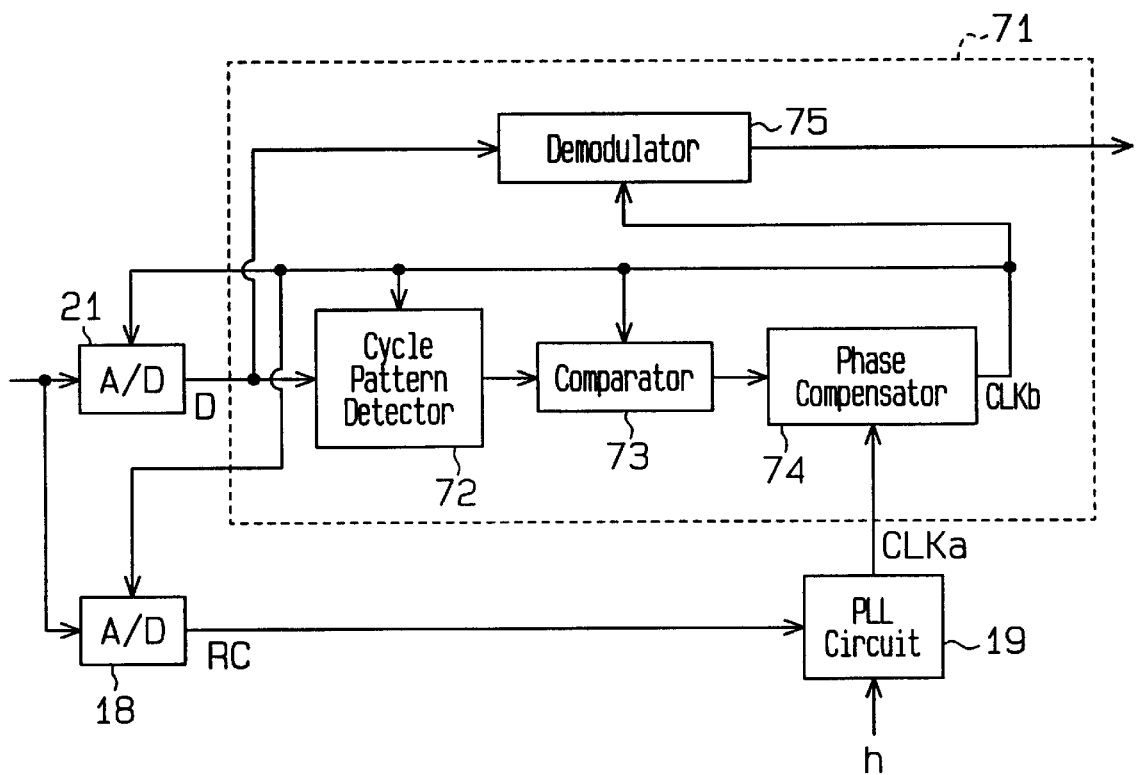
FIG. 14 is a schematic block diagram illustrating a reproduction circuit in accordance with the present invention.

FIG. 14 is a schematic block diagram showing a reproduction circuit 71 for reproducing the write data WD. The reproduction circuit 71 compensates for the phase of a clock signal CLKa output from the PLL circuit 19 based on the difference between the location of the clock information c and that of the cycle pattern "1001100" to generate a compensated clock signal CLKb. Data is reproduced in accordance with the compensated clock signal CLKb.

The reproduction circuit 71 includes a cycle pattern detector 72, a comparator 73, a phase compensator 74, and a demodulator 75. The cycle pattern detector 72 detects the cycle pattern "1001100" in accordance with the clock signal CLKb provided by the phase compensator 74. The comparator 73 compares the phase of the clock signal CLKa with the phase of a signal based on the cycle pattern "1001100" and generates a comparison signal. The phase compensator 74 compensates for the phase of the clock signal CLKa in accordance with the comparison signal from the comparator 73 to generate the compensated clock signal CLKb. Accordingly, the demodulator 75 reproduces data in accordance with the corrected clock signal CLKb. As a result, the number of errors that occur during the data read operation decreases, and the time required to access the optical disk 11 decreases.

The disk apparatus requires a slight amount of time from when the write data WD is output to when data is actually written on the optical disk 11. The data including the cycle pattern may thus be recorded at a location slightly offset from its predetermined location. Further, a slight delay occurs in the transmission system before the signal based on the data recorded on the optical disk 11 is received by the optical disk 11. Such factors may produce errors when data is reproduced in accordance with the clock signal CLKa generated from the clock signal c by the PLL circuit 19.

(b) The time information generating circuit 37 may incorporate a counter to count the clock signal CLK. In this case, the time information generating circuit 37 generates the time information signal k based on the count value output from the counter.

(c) The predetermined time period t during which a high time information signal k is output and the activating period of the phase comparator 32 may be completely separated from each other.

(d) The structure for deactivating the phase comparator 32 during the seek operation may be eliminated. That is, the inverter 45 and the AND circuit 44 of the control circuit 31 may be eliminated.

(e) The present invention may be applied to a data writing device which writes clock information when formatting the optical disk 11 or when recording data. In this case, information similar to the clock information (so-called VFO pattern) is written when formatting the recording medium or when recording data. The clock information and data are recorded through the same method. Thus, the first and second A/D converters 18, 21 may be replaced by a single A/D converter.

(f) The cycle of the clock signal CLK may be maintained as described below.

Figure 5:
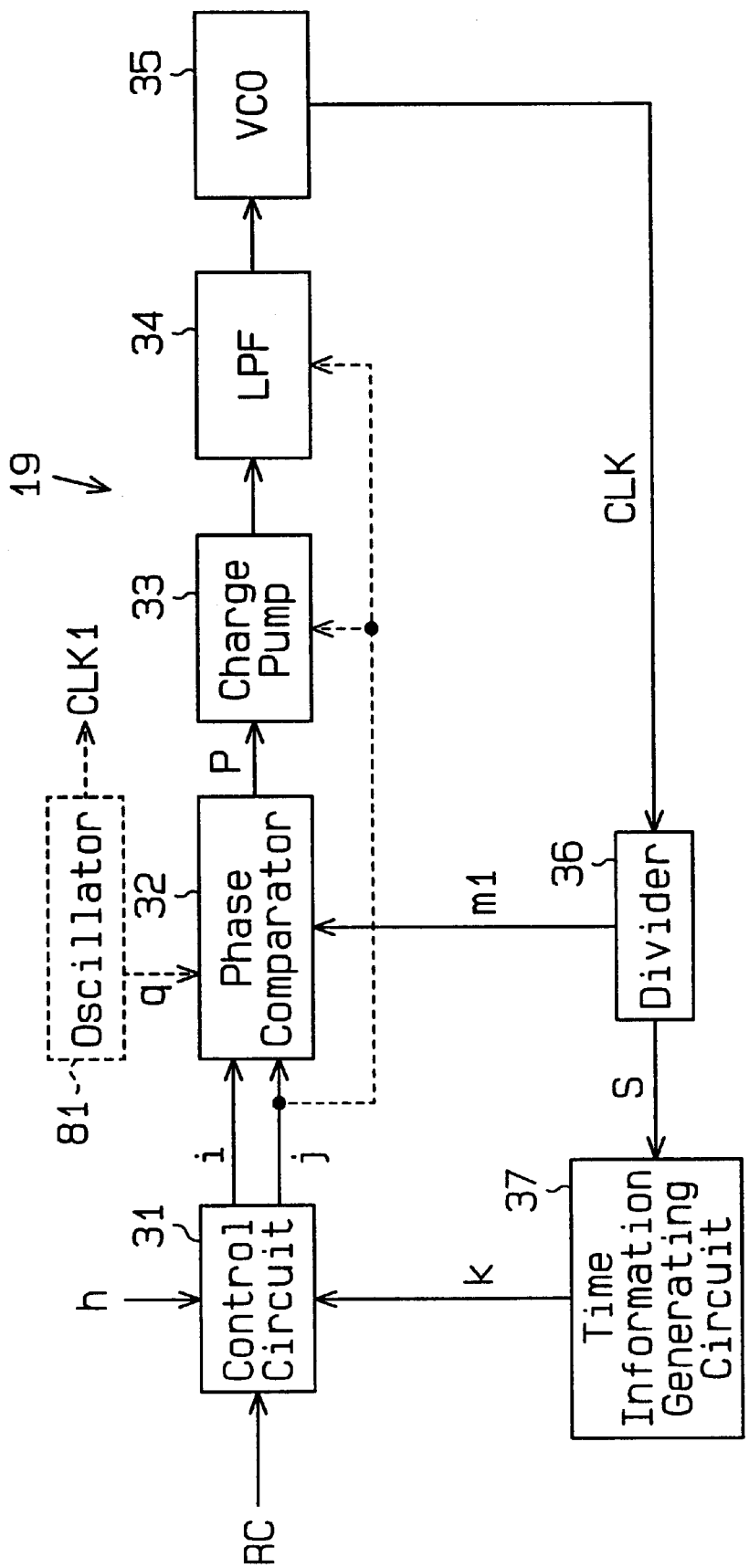
FIG. 5 is a schematic block diagram showing a PLL circuit of the disk apparatus of FIG. 4.

For example, as shown by the broken line in FIG. 5, the cycle of the clock signal CLK may be maintained by providing a low control signal j to the charge pump 33. In response to the low control signal j, the charge pump 33 maintains the current output regardless of the pulse signal from the phase comparator 32 to maintain the cycle of the clock signal CLK.

(g) If the clock signal RC does not rise within the predetermined time t, a clock signal CLK having a predetermined cycle may be output. For example, as shown by the broken line in FIG. 5, if the reference clock signal RC does not rise during the predetermined time period t, a time maintaining oscillator 81 provides a reference signal q having a predetermined cycle to the phase comparator 32. The phase comparator 32 outputs the signal P in accordance with the phase difference between the reference signal q and the divisional signal m1. In this manner, the reference signal q maintains the cycle of the clock signal CLK. Thus, a normal clock signal CLK is output. The time maintaining oscillator 81 may output a clock signal CLK1 having a predetermined cycle. In this case, if the reference clock signal does not rise during the predetermined period, the clock signal CLK1 is output in lieu of the clock signal CLK. The divider 36 divides the clock signal CLK1 and generates a divisional signal m1.

The present examples and embodiments are to be considered as illustrative and not restrictive, and the invention is not to be limited to the details given herein, but may be modified within the scope and equivalence of the appended claims.

What is claimed is:

1. A phase locked loop (PLL) circuit comprising:
   a phase comparator for comparing a phase of a reference signal and a phase of a feedback signal and generating a phase difference signal;
   a charge pump connected to the phase comparator to generate an output signal in accordance with the phase difference signal;
   a low-pass filter connected to the charge pump for smoothing the charge pump output signal and generating a control voltage signal;
   a voltage controlled oscillator connected to the low-pass filter to generate an oscillation output signal having a frequency corresponding to the control voltage signal;
   a divider connected to the voltage controlled oscillator to divide the oscillation output signal and generate the feedback signal;
   a time information generating circuit connected to the divider to generate time information from the oscillation output signal, wherein the time information indicates a predetermined time period during which a presumed input time of the reference signal is included; and
   a control circuit connected to the time information generating circuit, wherein the control circuit refers to the time information to permit the output of the oscillation output signal when the reference signal is being input during the predetermined time period and maintains the output of the oscillation output signal, having a predetermined cycle, when the reference signal is not being input during the predetermined time period.

2. The PLL circuit according to claim 1, wherein the oscillation output signal having the predetermined cycle is a preceding oscillation output signal generated by the voltage controlled oscillator.

3. The PLL circuit according to claim 2, wherein the control circuit controls the phase comparator so that the phase comparator is deactivated so that the output of the oscillation output signal having the predetermined cycle is maintained.

4. The PLL circuit according to claim 2, wherein the control circuit controls the charge pump so that the output of the charge pump output signal and the output of the oscillation output signal having the predetermined cycle are maintained.

5. The PLL circuit according to claim 2, wherein the control circuit controls the low-pass filter so that output of the control voltage signal from the low-pass filter is maintained and the output of the oscillation output signal having the predetermined cycle is maintained.

6. The PLL circuit according to claim 1, further comprising an oscillator connected to the phase comparator to provide the reference signal having a predetermined cycle to the phase comparator so that the output of the oscillation output signal having the predetermined cycle is maintained.

7. The PLL circuit according to claim 1, further comprising an oscillator for outputting the oscillation output signal having the predetermined cycle when the reference signal is not input during the predetermined time period.

8. The PLL circuit according to claim 1, wherein the divider includes a counter for counting the pulses of the oscillation output signal, and wherein the time information generating circuit generates time information based on the count value.

9. The PLL circuit according to claim 1, wherein the time information generating circuit includes a counter for counting the pulses of the oscillation output signal and generates the time information based on the count value.

10. The PLL circuit according to claim 1, wherein the reference signal is generated based on clock information recorded on a recording medium.

11. The PLL circuit according to claim 1, wherein the control circuit includes:
    a delay circuit for delaying the reference signal to generate a delay reference signal; and
    a detection circuit for receiving the time information from the time information generating circuit and outputting a renewal permission signal when the reference signal is input during the predetermined time period; and
    wherein the phase comparator includes:
    a first flip-flop circuit for outputting a first predetermined signal in response to the feedback signal received when the renewal permission signal is being output; and
    a second flip-flop circuit for outputting a second predetermined signal in response to the delay reference signal.

12. The PLL circuit according to claim 11, wherein the first and second flip-flop circuits clears a reset state in response to the renewal permission signal.

13. A control device of a phase locked loop (PLL) circuit, wherein the PLL circuit includes a voltage controlled oscillator for comparing the phase of a reference signal and the phase of a feedback signal and generating an oscillation output signal having a frequency corresponding to a control voltage signal, the control device including:
    a control circuit that refers to time information generated from the oscillation output signal and indicates a predetermined time period during which a presumed input time of the reference signal is included, wherein the control circuit permits the output of the oscillation output signal when the reference signal is input during the predetermined time period and maintains the output of the oscillation output signal, having a predetermined cycle, when the reference signal is not input during the predetermined time period.

14. The control device according to claim 13, wherein the oscillation output signal having the predetermined cycle is a preceding oscillation output signal generated by the voltage controlled oscillator.

15. The control device according to claim 14, wherein the PLL circuit includes a phase comparator for comparing the phase of the reference signal and the phase of the feedback signal to generate a phase difference signal, and wherein the control circuit controls the phase comparator so that the phase comparator is deactivated to maintain the output of the oscillation output signal having the predetermined cycle.

16. The control device according to claim 15, further comprising an oscillator connected to the phase comparator to provide the reference signal having a predetermined cycle to the phase comparator.

17. The control device according to claim 14, wherein the PLL circuit includes a low-pass filter for generating a control voltage signal, and wherein the control circuit controls the low-pass filter so that output of the control voltage signal from the low-pass filter is maintained and the output of the oscillation output signal having the predetermined cycle is maintained.

18. The control device according to claim 14, wherein the PLL circuit includes a charge pump for generating an output signal in accordance with a phase difference signal, and wherein the control circuit controls the charge pump so that the output of the charge pump output signal is maintained.

19. The control device according to claim 13, further comprising an oscillator for outputting an oscillation output signal having a predetermined cycle when the reference signal is not input during the predetermined time period.

20. The control device according to claim 13, wherein the PLL circuit includes a divider for dividing the oscillation output signal and generating the feedback signal, wherein the divider has a counter for counting the pulses of the oscillation output signal, and wherein the time information is generated based on the count value.

21. The control device according to claim 13, wherein the time information is generated based on a count value obtained by counting the pulses of the oscillation output signal.

22. The control device according to claim 13, wherein the reference signal is generated based on clock information recorded on a recording medium.

23. The control device according to claim 13, wherein the control circuit includes:
   a delay circuit for delaying the reference signal to generate a delay reference signal; and
   a detection circuit for outputting a renewal permission signal when the reference signal is input during the predetermined time period; and
   a phase comparator that includes:
      a first flip-flop circuit for outputting a first predetermined signal in response to the feedback signal received when the output of the renewal permission signal is being output; and
      a second flip-flop circuit for outputting a second predetermined signal in response to the delay reference signal.

24. The control device according to claim 23, wherein the first and second flip-flop circuits clear a reset state in response to the renewal permission signal.

25. A disk apparatus for reproducing data recorded on a recording medium and/or writing data on a recording medium in accordance with an oscillation output signal, the disk apparatus comprising:
   a phase locked loop (PLL) circuit for comparing a phase of a reference signal and a phase of a feedback signal, wherein the PLL circuit includes a voltage controlled oscillator for generating the oscillation output signal having a frequency corresponding to a control voltage signal, the reference signal being generated based on clock information recorded on the recording medium; and
   a control device of the PLL circuit, wherein the control device includes a control circuit that refers to time information generated from the oscillation output signal and indicates a predetermined time period during which a presumed input time of the reference signal is included, the control circuit permitting the output of the oscillation output signal when the reference signal is input during the predetermined time period and maintaining the output of the oscillation output signal having a predetermined cycle when the reference signal is not input during the predetermined time period.

26. The disk apparatus according to claim 25, wherein the control circuit maintains the output of the oscillation output signal having the predetermined cycle when the disk apparatus is performing a seek operation on the recording medium.

27. The disk apparatus according to claim 25, wherein the clock information is recorded when the recording medium is manufactured.

28. The disk apparatus according to claim 25, wherein the clock information is recorded when the recording medium is formatted or when data is recorded.

29. The disk apparatus according to claim 25, wherein a cycle pattern is recorded on the recording medium, the disk apparatus further comprising a phase compensating circuit for compensating the phase of the oscillation output signal of the PLL circuit in accordance with the cycle pattern.

30. A method for controlling a phase locked loop (PLL) circuit of a disk apparatus, wherein the disk apparatus reproduces data recorded on a recording medium and/or writes data on a recording medium in accordance with a clock signal, and wherein the PLL circuit compares a phase of a reference signal and a phase of a feedback signal to determine if they match a phase of the clock signal, the method comprising the steps of:
   deactivating the phase matching carried out by the PLL circuit to maintain the output of the clock signal preceding a seek operation when the disk apparatus is performing the seek operation on the recording medium; and
   commencing the phase matching when the seek operation is completed.

* * * * *